US011478049B2

(12) United States Patent
Burks et al.

(10) Patent No.: US 11,478,049 B2
(45) Date of Patent: Oct. 25, 2022

(54) STRAP ADJUSTMENTS VIA SENSORS

(71) Applicant: HEWLETT-PACKARD DEVELOPMENT COMPANY, L.P., Spring, TX (US)

(72) Inventors: Ricky Thomas Burks, Houston, TX (US); Brandon James Lee Haist, Houston, TX (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 509 days.

(21) Appl. No.: 16/496,787

(22) PCT Filed: Mar. 23, 2017

(86) PCT No.: PCT/US2017/023709
§ 371 (c)(1),
(2) Date: Sep. 23, 2019

(87) PCT Pub. No.: WO2018/174879
PCT Pub. Date: Sep. 27, 2018

(65) Prior Publication Data
US 2020/0375322 A1 Dec. 3, 2020

(51) Int. Cl.
*A44B 11/00* (2006.01)
*A42B 7/00* (2006.01)
(Continued)

(52) U.S. Cl.
CPC .............. *A44B 11/00* (2013.01); *A42B 7/00* (2013.01); *A63F 13/98* (2014.09); *G01L 5/10* (2013.01);
(Continued)

(58) Field of Classification Search
CPC . A44B 11/00; A63F 13/98; A42B 7/00; G01L 5/10; G02B 27/0176; G05B 13/021;
(Continued)

(56) References Cited

U.S. PATENT DOCUMENTS 5,003,300 A 3/1991 Wells
5,682,172 A 10/1997 Travers et al.
(Continued)

FOREIGN PATENT DOCUMENTS

CN 101840068 9/2010
CN 103908247 A 7/2014
(Continued)

OTHER PUBLICATIONS

Beers Tiffany et al. Motorized Tensioning system with sensor Mar. 6, 2014 WIPO WO 2014036374 A1 abstract, paragraphs [0063], [0075-0079], [0081-0084], [0090-0093], [0146], [0157], [0164-0167], [0174-0178], figures 37-39, Claims positions 150,152,160,170,180, 220, 300, 302, 354, 358, 380, 382.*
(Continued)

*Primary Examiner* — Prabodh M Dharia
(74) *Attorney, Agent, or Firm* — Brooks Cameron & Huebsch PLLC

(57) ABSTRACT

Example implementations relate to a display and strap with sensors. In some examples, an apparatus may comprise a strap, a pressure sensor coupled to the strap, and a display coupled to the strap. In some examples, the apparatus may include a tensioner mechanism coupled to the strap and a motor coupled to the tensioner mechanism. The motor may actuate the tensioner mechanism to adjust the strap to a particular amount of tension, and the particular amount of tension may be based on an amount of pressure detected by the pressure sensor.

16 Claims, 4 Drawing Sheets

(51) Int. Cl.

| | | |
|---|---|---|
| *G01L 5/10* | (2020.01) | |
| *G02B 27/01* | (2006.01) | |
| *H05K 5/00* | (2006.01) | |
| *H05K 5/02* | (2006.01) | |
| *G05B 13/02* | (2006.01) | |
| *A63F 13/98* | (2014.01) | |
| *A63F 13/26* | (2014.01) | |

(52) U.S. Cl.
CPC ....... *G02B 27/0176* (2013.01); *G05B 13/021* (2013.01); *H05K 5/0017* (2013.01); *H05K 5/0086* (2013.01); *H05K 5/0217* (2013.01); *A63F 13/26* (2014.09); *A63F 2300/301* (2013.01)

(58) Field of Classification Search
CPC ... H05K 5/0017; H05K 5/0086; H05K 5/0217
USPC .......... 446/27; 345/8, 633; 600/300; 428/27
See application file for complete search history.

(56) References Cited

U.S. PATENT DOCUMENTS

| | | | |
|---|---|---|---|
| 5,809,873 A * | 9/1998 | Chak ................. | B65B 13/22 100/29 |
| 5,954,642 A * | 9/1999 | Johnson ............. | G02B 27/0176 600/300 |
| 7,454,877 B2 * | 11/2008 | Morrison ............ | B65B 13/10 100/32 |
| 9,049,512 B1 | 6/2015 | Kulavik et al. | |
| 9,285,589 B2 | 3/2016 | Osterhout et al. | |
| 11,036,054 B2 * | 6/2021 | Poore ................. | G06F 3/013 |
| 2004/0117891 A1 | 6/2004 | Hannula | |
| 2009/0253996 A1 | 10/2009 | Lee et al. | |
| 2015/0253574 A1 | 9/2015 | Thurber | |
| 2015/0335848 A1 | 11/2015 | Eury et al. | |
| 2016/0096055 A1 * | 4/2016 | Smock ................ | A63B 71/022 482/27 |
| 2016/0361512 A1 * | 12/2016 | Lawrenson ....... | A61M 16/0683 |
| 2016/0363772 A1 | 12/2016 | Miller | |
| 2017/0277254 A1 * | 9/2017 | Osman ................ | A63F 13/32 |
| 2018/0035786 A1 * | 2/2018 | Willet, Jr. .......... | A45D 44/22 |

FOREIGN PATENT DOCUMENTS

| | | |
|---|---|---|
| CN | 104571514 | 4/2015 |
| CN | 204409713 | 6/2015 |
| CN | 104808341 | 7/2015 |
| CN | 104822284 | 8/2015 |
| CN | 105495810 A | 4/2016 |
| CN | 105581438 A | 5/2016 |
| CN | 106054391 | 10/2016 |
| WO | WO-2014036374 A1 | 3/2014 |
| WO | WO-2014036374 | 3/2015 |
| WO | WO-2015128173 | 9/2015 |
| WO | WO-2017009233 | 1/2017 |

OTHER PUBLICATIONS

Luxebell 3D VR Glasses Virtual Reality Headset with Adjustable Strap,include Bluetooth Remote, NFC (Remote Contol), 2015, <http://www.luxebell.net/home/117-luxebell-3d-vr-glasses-virtual-reality-headset-with-adjustable-strapinclude-bluetooth-remote-nfc-remote-contol.html>.

* cited by examiner

STRAP ADJUSTMENTS VIA SENSORS

BACKGROUND

Headsets may be used in virtual reality (VR) and/or augmented reality (AR) systems. VR and/or AR headsets may be worn by a user and may include displays to provide a "virtual" and/or "augmented" reality to the user by providing images, screens, and/or other visual stimuli to the user via the displays.

DETAILED DESCRIPTION

Figure 1:
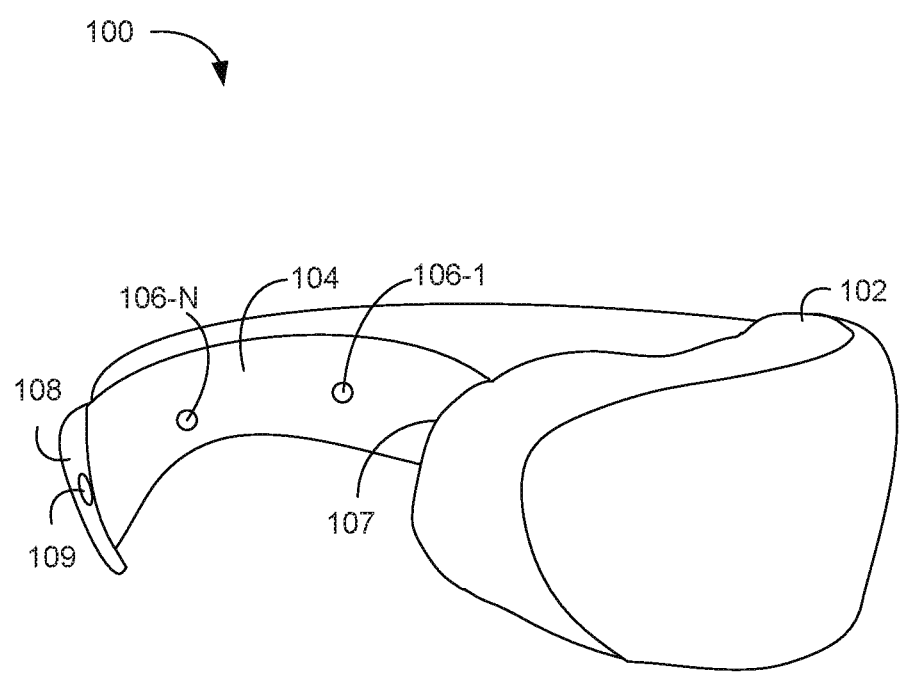
FIG. 1 illustrates an example of an apparatus for strap adjustments via sensors consistent with the disclosure.

Head mounted displays may be used in virtual reality (VR) and/or augmented reality (AR) systems. In some examples, a VR system may cover a user's eyes and provide visual stimuli to the user via a display, thereby substituting a "virtual" reality for actual reality. The VR system may allow the user to interact with the "virtual" reality world through games, educational activities, group activities, and the like.

An AR system may provide an overlay transparent or semi-transparent screen in front of a user's eyes such that reality is "augmented" with additional information such as graphical representations and/or supplemental data. For example, an AR system may overlay transparent or semi-transparent weather information, directions, and/or other information on an AR display for a user to examine.

VR/AR headsets may be used in many different fields and/or for many different applications. For example, VR/AR headsets may be used in gaming, aviation, engineering, medicine, geopositioning, training, military, government (e.g., fire, police, etc.), and sports, among other fields.

An example of a VR/AR headset may include a display and a strap coupled to the display. The strap may facilitate keeping the display in a specific position on a user's head such that the user is able to see the visual stimuli on the display. In some approaches, the strap(s) may be manually adjustable to facilitate keeping the display in a specific position on the user's head. For example, in some approaches, manually adjustable strap(s) may be provided to the VR/AR headset. In such approaches, properly adjusting the straps such that the user can see the visual stimuli on the display without the headset moving around may include manually adjusting each of the strap(s) until a desired position and fit of the headset are achieved. As used herein, a "display" may include a display screen (e.g., a liquid crystal display, light emitting diode display, vacuum fluorescent display, or other suitable display device) and/or a housing to accommodate the display screen.

Manual adjustment of each strap(s) may be cumbersome and it may be difficult and/or time-consuming. For example, in the case of a VR/AR headset having multiple straps, it may be difficult and/or tedious to get an amount of tension on each strap to a desirable level such that the headset is held in place on the user's head and such that the user can see the visual stimuli on the display. The difficult and/or tedious nature of manually adjusting the strap(s) on the headset may be exacerbated in situations in which multiple users might share a particular VR/AR headset, for example in an amusement park setting, video game arcade setting, or a training scenario in which a particular VR/AR headset can be shared between multiple users.

If the headset is not properly positioned on the user's head (e.g., if the strap(s) are not correctly adjusted), the user may experience discomfort, grainy or otherwise degraded display performance, dizziness, and/or nausea. Accordingly, proper adjustment of the VR/AR headset strap(s) may improve a user's VR/AR experience.

In contrast, some examples herein may allow for a strap of a VR/AR headset to be automatically adjusted to a particular amount of tension. In some examples, this may allow for a reduction in time and difficulty in putting the VR/AR headset on and in adjusting the strap to a proper amount of tension to facilitate a user experience that is not beleaguered with display performance, discomfort, graininess, and/or other issues that may arise under some other approaches.

Examples of the disclosure include apparatuses, systems, and methods for a display and strap with sensors. In some examples, an apparatus may comprise a strap, a pressure sensor coupled to the strap, and a display coupled to the strap. In some examples, the apparatus may include a tensioner mechanism coupled to the strap and a motor coupled to the tensioner mechanism. The motor may be to actuate the tensioner mechanism to adjust the strap to a particular amount of tension, and the particular amount of tension may be based on an amount of pressure detected by the pressure sensor.

FIG. 1 illustrates an example of an apparatus for strap adjustments via sensors consistent with the disclosure. In some examples, the apparatus may be a VR/AR headset. As shown in FIG. 1A, the apparatus 100 may include a display 102, strap 104, sensors 106-1, . . . , 106-N, motor 108, and tensioner mechanism 109. For example, apparatus 100 may include strap 104 and pressure sensor(s) 106-1, . . . , 106-N coupled to the strap. Display 102 may be coupled to the strap 104. In some examples, a tensioner mechanism 109 may be coupled to the strap 104. A motor 108 may be coupled to the tensioner mechanism. The motor 108 may actuate the tensioner mechanism 109 to adjust the strap 104 to a particular amount of tension. In some examples, the particular amount of tension may be based on an amount of pressure detected by the pressure sensor(s) 106-1, . . . , 106-N.

The display 102 may comprise a VR or AR display. For example, display 102 may, in the case of a VR display, provide visual stimuli to the user via a display, thereby substituting a "virtual" reality for actual reality. In the case of an AR display, display 102 may overlay transparent or semi-transparent screen in front of a user's eyes such that reality is "augmented" with additional information.

The strap 104 may comprise an non-elastic and/or elastic material. In some examples, the strap 104 may be made of a combination of elastic materials such as latex, rubber, elastomers, and/or other materials that provide a stretchable, deformable, or otherwise tensionable material. However, examples are not limited to latex, rubber, and/or elastomers, however, and the strap 104 may be made from any suitable material or fabric to form the strap 104. In some examples, the strap 104 may be an electro-mechanically adjustable strap.

In some examples, the strap 104 may be coupled to the display 102 at a first end 107 of the strap 104 and at a second end (not shown for ease of illustration) of the strap 104. As illustrated in FIG. 1, the first end 107 of the strap 104 can correspond to a first distal end of the strap 104 and the second end of the strap 104 can correspond to a second distal end of the strap opposite the first distil end of the strap 104, among other possibilities. The tensioner mechanism 109 may be coupled to the strap 104 at a location on the strap 104 between the first end and the second end.

As shown in FIG. 1, the pressure sensors 106-1, . . . , 106-N may be coupled to the strap 104. In some examples, an individual pressure sensor (e.g., pressure sensor 106-1) may be coupled to the strap. However, examples are not limited to the strap 104 having an individual pressure sensor 106-1 coupled thereto, and a plurality of pressure sensors 106-1, . . . , 106-N may be coupled to the strap 104. As used herein, a "pressure sensor" is a device that measures a force per unit area. Examples of pressure sensors include absolute pressure sensors, gauge pressure sensors, differential pressure sensors, and/or sealed pressure sensors.

Although explicitly shown in FIG. 1 as being located on a particular side of the strap 104, the pressure sensors 106-1, . . . , 106-N may be located at any location along the strap 104. For example, a first pressure sensor 106-1 may be located on a first side of the strap 104 relative to the user's head, and a second pressure sensor may be located on second side of the strap 104 that is opposite to the first side of the strap 104 relative to the user's head. In some examples, pressure sensor(s) may be coupled to the display 102, motor 108, and/or tensioner mechanism 109.

The motor 108 may comprise an electric motor, while the tensioner mechanism 109 may comprise any suitable tensioner mechanism. As used herein, a "tensioner mechanism" is a device that applies a force to create or maintain tension. Examples of tensioner mechanisms include rotatable tensioner mechanisms (e.g., a BOA® tensioner mechanism), belt and/or chain tensioner mechanism, etc. In some examples, the motor 108 and/or tensioner mechanism 109 may be operable to adjust the strap 104 to a particular amount of tension based on an amount of pressure detected by the pressure sensor(s) 106-1, . . . , 106-N.

Figure 2:
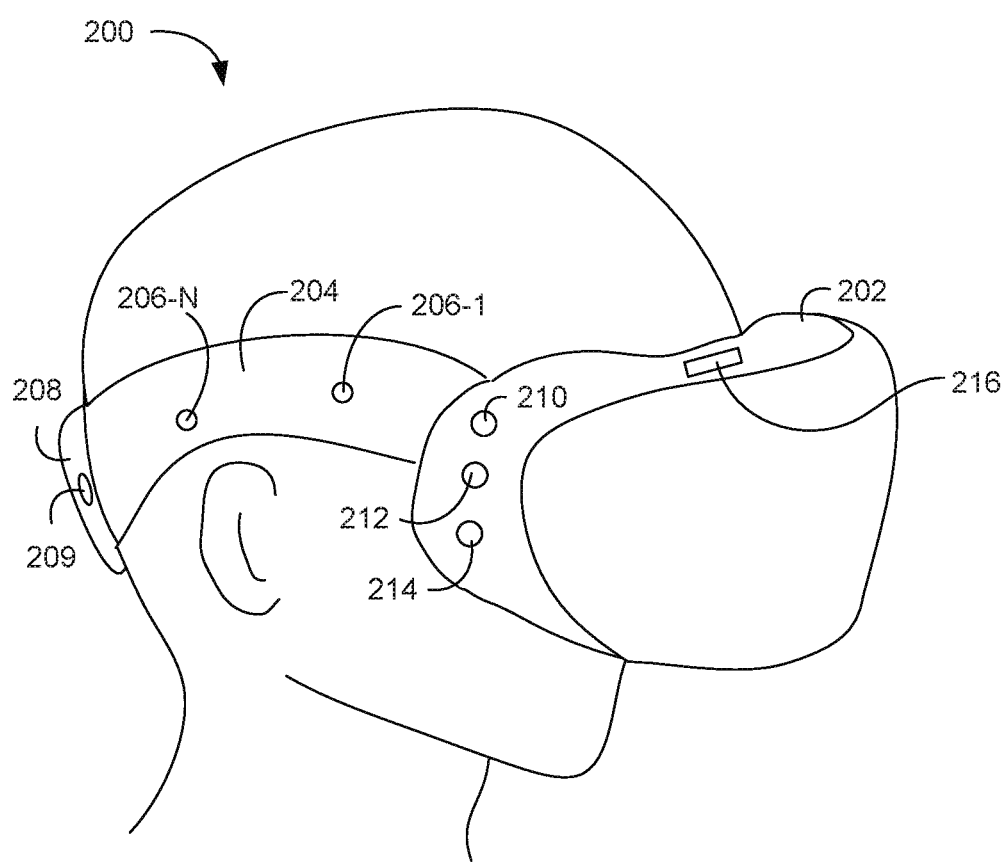
FIG. 2 illustrates another example of an apparatus for strap adjustments via sensors consistent with the disclosure.

FIG. 2 illustrates another example of an apparatus for strap adjustments via sensors consistent with the disclosure. As shown in FIG. 2, the apparatus 200 may include a display 202, strap 204, sensors 206-1, . . . , 206-N, motor 208, tensioner mechanism 209, a plurality of switch mechanisms 210, 212, 214, and a processing resource 216. As described above in connection with FIG. 1, the apparatus 200 may provide automatic adjustment of the strap 204 via the motor 208 and/or tensioner mechanism 209.

As used herein, a "switch mechanism" is an electrical component that completes or disables an electrical circuit when engaged or disengaged. For example, a switch mechanism removes or restores the conducting path of an electrical circuit when operated. Non-limiting examples of switch mechanisms include buttons (e.g., pushbuttons), single pole single throw switches, single pole double throw switches, single pole changeover switches, double pole single throw switches, etc. The term switch may be used herein to describe a switching mechanism.

The plurality of switch mechanisms 210, 212, 214 may be actuateable to alter an amount of tension applied by the motor 208 and/or the tensioner mechanism 209. In some examples, switch mechanism 210 may be actuatable to cause the motor 208 to actuate the tensioner mechanism 209 to adjust the strap 204 to a particular amount of tension responsive to actuation of the switch mechanism 210. The particular amount of tension may be based on an amount of pressure detected by the pressure sensor 206-1, . . . , 206-N. For example, a user may place the apparatus 200 over their head in anticipation of enjoying a VR/AR experience. The user may actuate switch mechanism 210 to automatically adjust the strap to a particular tension, which may be based on an amount of pressure detected by the pressure sensor(s) 206-1, . . . , 206-N.

Switch mechanisms 212 and/or 214 may be actuatable to "fine tune" adjustment of the strap 204 to an amount of pressure that is different than a particular pressure (e.g., a predetermined initial particular pressure). For example, switch mechanism 212 may be used to cause the motor 208 to actuate the tensioner mechanism 209 to adjust the strap to an amount of tension greater than the particular amount of tension. Similarly, switch mechanism 214 may be used to cause the motor 208 to actuate the tensioner mechanism 209 to adjust the strap to an amount of tension less than the particular amount of tension.

In some examples, the processing resource 216 may be coupled to the display 202, the motor 208, and/or the pressure sensors 206-1, . . . , 106-N. The processing resource 216 may execute instructions to perform various tasks. For example, the processing resource 216 may execute instructions to receive information from the pressure sensors 206-1, . . . , 206-N. The information received from the pressure sensors 206-1, . . . , 206-N may include information regarding an amount of pressure detected by the pressure sensors 206-1, . . . , 206-N. Although shown in a specific location in FIG. 2, the processing resource 216 may be located in any location in or on the display 202, strap 204, or may be located in a location that is not physically on or in the display 202 or strap 204, so long as the processing resource 216 is communicatively coupled to the display 202, the motor 208, and/or the pressure sensor(s) 206-1, . . . , 206-N.

In some examples, the processing resource 216 may determine that the motor 208 has adjusted the strap 204 to the particular amount of tension responsive to the information received from the pressure sensors 206-1, . . . , 206-N. For example, the processing resource 216 may execute instructions to stop the motor 208 from operating in response to a determination that the motor 208 has adjusted the strap 204 to the particular amount of tension based on the information received from the pressure sensors 206-1, . . . , 206-N.

Figure 3:
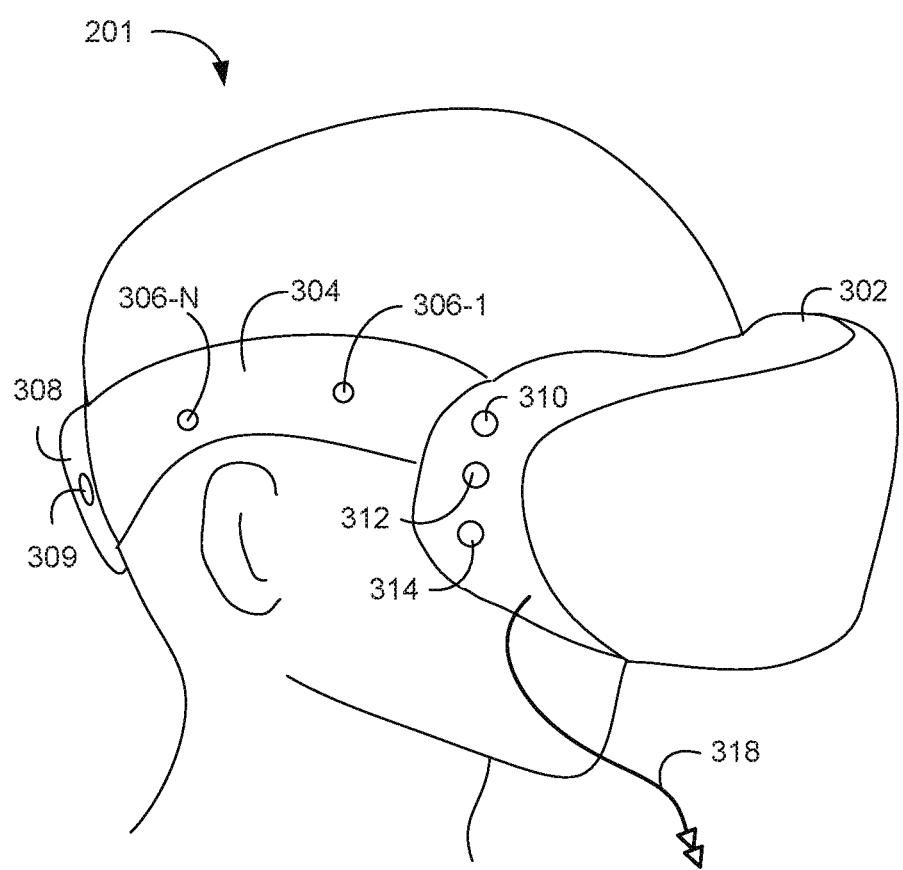
FIG. 3 illustrates an example of a system for strap adjustments via sensors consistent with the disclosure.

FIG. 3 illustrates an example of a system for strap adjustments via sensors consistent with the disclosure. As shown in FIG. 3, the apparatus 301 may include a display 302, strap 304, sensors 306-1, . . . , 306-N, motor 308, tensioner mechanism 309, a plurality of switch mechanisms 310, 312, 314, and a power supply 318. For example, the system 301 may include strap 304 (e.g., an electro-mechanically adjustable strap) including a plurality of pressure sensors 306-1, . . . , 306-N. Display 302 and motor 308 may be coupled to the electro-mechanically adjustable strap 304. The tensioner mechanism 309 may be coupled to the motor 308 and the electro-mechanically adjustable strap 304, and may be actuatable by the motor 308 to adjust the electro-mechanically adjustable strap 304 to a particular amount of tension based on an amount of pressure detected by the plurality of pressure sensors 306-1, . . . , 306-N. In some examples, the system 301 may further include power supply 318, which may be coupled to the display 302, and/or motor 308.

The power supply 218 may comprise a universal serial bus (USB) cable, USB-to-micro USB cable, firewire cable, thunderbolt cable, or other cable suitable for providing power and/or data transfer to and/or from the system 201. In some examples, the power supply 218 may provide power over Ethernet to the system 301.

In some examples, the power supply 318 may supply power from a host computing device to the display 302 and/or the motor 308. Examples are not so limited; however, and the power supply 318 may supply power from a battery or other suitable power source. As used herein, a "host computing device" is a physical computing device such as a personal computer, a laptop, a tablet, or the like.

The electro-mechanically adjustable strap 304 may, as described in more detail above, comprise an elastic material. In some examples, the electro-mechanically adjustable strap 304 may be coupled to the display 302 at a first end of the strap 304 and at a second end of the strap 304. In some examples, the tensioner mechanism 309 may be coupled to the electro-mechanically adjustable strap 304 at a location on the strap that is equidistant from the first end and the second end of the electro-mechanically adjustable strap 304.

In some examples, the system 301 may include a plurality of switch mechanisms 310, 312, 314 disposed on the display 302. As used herein, "disposed" refers to a state of being physically located on and physically coupled to something. In some examples, the tensioner mechanism 309 may be actuateable by the motor 308 to adjust the electro-mechanically adjustable strap 304 to the particular amount of tension responsive a first switch mechanism (e.g., switch mechanism 310) among the plurality of switch mechanisms 310, 312, 314 being actuated. The tensioner mechanism 309 may be actuateable by the motor 308 to adjust the electro-mechanically adjustable strap 304 to a tension greater than the particular amount of tension responsive to a switch mechanism (e.g., switch mechanism 312) among the plurality of switch mechanisms 310, 312, 314 that is different than the first switch mechanism (e.g., switch mechanism 310) being actuated. In some examples, this may allow for a user to "fine tune" the tension applied to the electro-mechanically adjustable strap 304 to provide additional tightening past the automatic adjustment provided by the system 301.

Similarly, in some examples, the tensioner mechanism 309 may be actuateable by the motor 308 to adjust the electro-mechanically adjustable strap 304 to the particular amount of tension responsive to a first switch mechanism (e.g., switch mechanism 310) among the plurality of switch mechanisms 310, 312, 314 being actuated, and the tensioner mechanism 309 may be actuateable by the motor 308 to adjust the electro-mechanically adjustable strap 304 to a tension less than the particular amount of tension responsive a switch mechanism (e.g., switch mechanism 314) among the plurality of switch mechanisms 310, 312, 314 that is different than the first switch mechanism (e.g., switch mechanism 310) being actuated. In some examples, this may allow for a user to "fine tune" the tension applied to the electro-mechanically adjustable strap 304 to provide reduced tightening past the automatic adjustment provided by the system 301.

Figure 4:
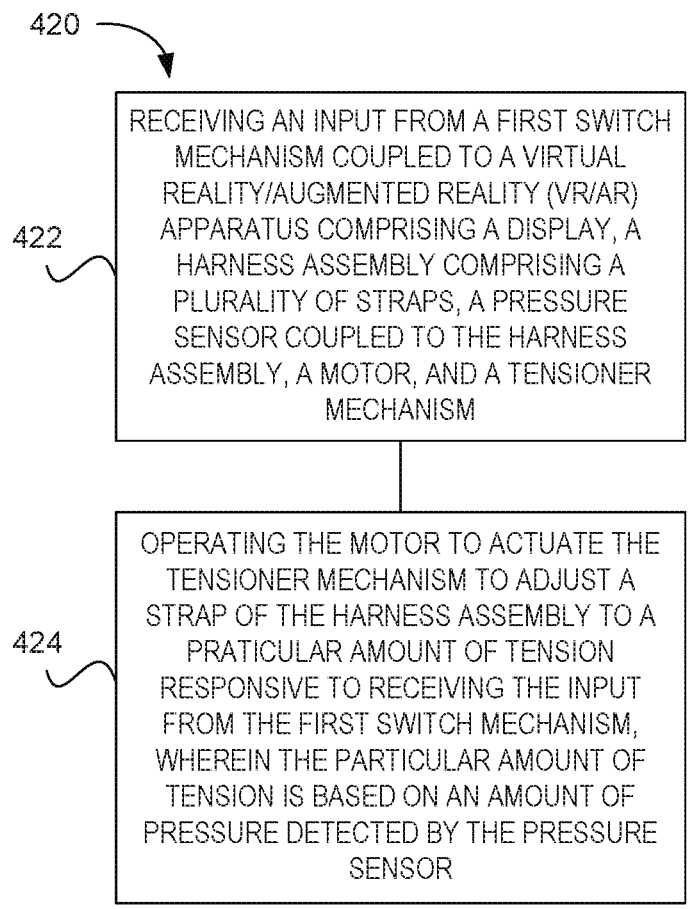
FIG. 4 illustrates an example flow diagram illustrating an example of a method for strap adjustments via sensors consistent with the disclosure.

FIG. 4 illustrates an example flow diagram illustrating an example of a method for strap adjustments via sensors consistent with the disclosure. At 422, the method may include receiving an input from a first switch mechanism coupled to a VR/AR apparatus including a display, a harness assembly including a plurality of straps, a pressure sensor coupled to the harness assembly, a motor, and a tensioner mechanism. In some examples, the display, pressure sensor, motor, and tensioner mechanism may be analogous to the display, pressure sensor, motor, and tensioner mechanism described in FIGS. 1, 2, and 3, herein. The straps of the harness assembly may be analogous to strap(s) described in FIGS. 1, 2, and 3, herein.

At 424, the method 420 may include operating the motor to actuate the tensioner mechanism to adjust a strap of the harness assembly to a particular amount of tension responsive to receiving the input from the first switch mechanism. In some examples, the particular amount of tension is based on an amount of pressure detected by the pressure sensor. For example, an input received by actuating the switch mechanism may cause the motor to operate to actuate the tensioner mechanism to adjust a strap of the harness assembly.

In some examples, the method 420 may further include operating the motor to actuate the tensioner mechanism to adjust the strap of the harness assembly to an amount of tension greater than or less than the particular amount of tension responsive to receiving an input from a second switch mechanism that is coupled to the VR/AR apparatus. For example, a second switch mechanism coupled to the VR/AR device may be actuated to operate the motor to actuate the tensioner mechanism to increase or decrease the amount of tension on the harness assembly and/or a strap of the harness assembly. This may allow for a user to "fine tune" the amount of pressure exerted by the harness assembly on the user's head for comfort and/or alleviation of grainy display.

In the foregoing detailed description of the disclosure, reference is made to the accompanying drawings that form a part hereof, and in which is shown by way of illustration how examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the disclosure. As used herein, designators such as "N", etc., particularly with respect to reference numerals in the drawings, indicate that a number of the particular feature so designated can be included. A "plurality of" is intended to refer to more than one of such things. Multiple like elements may be referenced herein by their reference numeral without a specific identifier at the end. For example, a plurality of sensors 106-1, . . . , 106-N may be referred to herein as sensors 106.

The figures herein follow a numbering convention in which the first digit corresponds to the drawing figure number and the remaining digits identify an element or component in the drawing. For example, reference numeral 102 may refer to element "02" in FIG. 1 and an analogous element may be identified by reference numeral 202 in FIG. 2. Elements shown in the various figures herein can be added, exchanged, and/or eliminated so as to provide a number of additional examples of the disclosure. In addition, the proportion and the relative scale of the elements provided in the figures are intended to illustrate the examples of the disclosure, and should not be taken in a limiting sense.

What is claimed:
1. An apparatus, comprising:
 a strap;
 a pressure sensor coupled to the strap;
 a display coupled to a strap;
 a tensioner mechanism coupled to the strap;
 a motor coupled to the tensioner mechanism, the motor to actuate the tensioner mechanism to adjust the strap to a particular amount of tension, wherein the particular amount of tension is based on an amount of pressure detected by the pressure sensor; and a switch mechanism disposed on the display, the switch mechanism to cause the motor to actuate the tensioner mechanism to adjust the strap to an amount of tension different than the particular amount of tension.

2. The apparatus of claim 1, further comprising a processing resource coupled to the display, the motor, and the pressure sensor, the processing resource to:
receive information from the pressure sensor; and
determine that the motor has adjusted the strap to the particular amount of tension responsive to the information received from the pressure sensor.

3. The apparatus of claim 1, further comprising a second switch mechanism coupled to the display to cause the motor is to actuate the tensioner mechanism to adjust the strap to the particular amount of tension responsive to actuation of the second switch mechanism, prior to the switch mechanism causing the motor to actuate the tensioner mechanism.

4. The apparatus of claim 1, further comprising a plurality of switch mechanism including:
a first switch mechanism disposed on the display, the first switch mechanism to cause the motor to actuate the tensioner mechanism to adjust the strap to an amount of tension greater than the particular amount of tension; and
a second switch mechanism disposed on the display, the second switch mechanism to cause the motor to actuate the tensioner mechanism to adjust the strap to an amount of tension less than the particular amount of tension.

5. The apparatus of claim 1, wherein the tensioner mechanism includes a rotatable tensioner mechanism.

6. The apparatus of claim 1, wherein the strap is coupled to the display at a first end of the strap and at a second end of the strap, and wherein the tensioner mechanism is coupled to the strap at a location on the strap between the first end and the second end.

7. A system, comprising:
an electro-mechanically adjustable strap including a plurality of pressure sensors;
a display coupled to the electro-mechanically adjustable strap;
a motor coupled to the electro-mechanically adjustable strap;
a tensioner mechanism coupled to the motor and the electro-mechanically adjustable strap, wherein the tensioner mechanism is actuateable by the motor to adjust the electro-mechanically adjustable strap to a particular amount of tension based on an amount of pressure detected by the plurality of pressure sensors;
a switch mechanism disposed on the display, the switch mechanism to cause the motor to actuate the tensioner mechanism to adjust the electro-mechanically adjustable strap to an amount of tension different than the particular amount of tension; and
a power supply coupled to the display and the motor.

8. The system of claim 7, wherein the power supply is to supply power from a host computing device to the display and the motor.

9. The system of claim 7, wherein the power supply is to supply power from a battery to the display and the motor.

10. The system of claim 7, wherein a portion of the electro-mechanically adjustable strap includes an elastic material, a non-elastic material, or a combination thereof.

11. The system of claim 7, wherein the electro-mechanically adjustable strap is coupled to the display at a first distal end of the strap and at a second distal end of the strap, and wherein the tensioner mechanism is coupled to the electro-mechanically adjustable strap at a location on the strap that is equidistant from the first distal end and the second distal end of the electro-mechanically adjustable strap.

12. The system of claim 7, further comprising a plurality of switch mechanisms disposed on a housing of the display, wherein:
the tensioner mechanism is actuateable by the motor to adjust the electro-mechanically adjustable strap to the particular amount of tension responsive a first switch mechanism among the plurality of switch mechanisms being actuated; and
the tensioner mechanism is actuateable by the motor to adjust the electro-mechanically adjustable strap to an amount of tension greater than the particular amount of tension responsive the switch mechanism being actuated.

13. The system of claim 7, further comprising a plurality of switch mechanisms disposed on a housing of the display, wherein:
the tensioner mechanism is actuateable by the motor to adjust the electro-mechanically adjustable strap to the particular amount of tension responsive a first switch mechanism among the plurality of switch mechanisms being actuated; and
the tensioner mechanism is actuateable by the motor to adjust the electro-mechanically adjustable strap to an amount of tension less than the particular amount of tension responsive the switch mechanism being actuated.

14. A method, comprising:
receiving an input from a first switch mechanism coupled to a virtual reality/augmented reality (VR/AR) apparatus including a display, a harness assembly comprising straps, a pressure sensor coupled to the harness assembly, a motor, and a tensioner mechanism;
actuating the tensioner mechanism to adjust a strap of the harness assembly to a particular amount of tension responsive to receiving the input from the first switch mechanism, wherein
the particular amount of tension is based on an amount of pressure detected by the pressure sensor; and
adjusting the straps to an amount of tension different than the particular amount of tension based on input from a second switch mechanism.

15. The method of claim 14, further comprising operating the motor to actuate the tensioner mechanism to adjust the strap of the harness assembly to an amount of tension greater than the particular amount of tension responsive to receiving an input from a second switch mechanism that is coupled to the VR/AR apparatus.

16. The method of claim 14, further comprising operating the motor to actuate the tensioner mechanism to adjust the strap of the harness assembly to an amount of tension less than the particular amount of tension responsive to receiving an input from a second switch mechanism that is coupled to the VR/AR apparatus.

* * * * *